United States Patent [19]
DeNardis

[11] Patent Number: 4,682,103
[45] Date of Patent: Jul. 21, 1987

[54] CIRCUITRY FOR TESTING GENERATOR OUTPUT

[76] Inventor: Nicholas F. DeNardis, Rte. 1, Box 209A, Greenwood, Wis. 54437

[21] Appl. No.: 629,205

[22] Filed: Jul. 6, 1984

[51] Int. Cl.⁴ .................. G01R 31/00; H02K 11/00
[52] U.S. Cl. ................. 324/158 MG; 322/99
[58] Field of Search ............... 324/158 MG; 322/99; 320/48

[56] References Cited

U.S. PATENT DOCUMENTS

| | | |
|---|---|---|
| 836,359 | 11/1906 | Behrend . |
| 2,578,694 | 12/1951 | Goldman .......................... 171/252 |
| 2,640,100 | 5/1953 | Packer et al. ..................... 175/183 |
| 2,841,768 | 7/1958 | Robinson ........................... 324/158 |
| 3,215,935 | 11/1965 | Mead et al. ....................... 324/158 |
| 3,893,029 | 7/1975 | Vensel et al. ..................... 324/158 |
| 3,999,127 | 12/1976 | Siegl .................................. 324/158 |
| 4,070,624 | 1/1978 | Taylor ............................... 324/158 |

OTHER PUBLICATIONS

Fitzgerald, A. et al., *Electric Machinery*, 3rd ed., pp. 292-300.

*Primary Examiner*—Reinhard J. Eisenzopf
*Assistant Examiner*—Stephen M. Baker
*Attorney, Agent, or Firm*—Leo Gregory

[57] ABSTRACT

This invention relates to a circuitry for easily and quickly testing the output current capacity of a generator by connecting the generator as a controlled current source, applying to the generator's field terminals an independent voltage proportioned relative to the rated output voltage of the generator, connecting an ammeter across the output terminals of the generator, the ammeter reading being calibrated to be equal to the reciprocal of the proportioned voltage, thus providing a direct reading of output current capacity representing the full output capacity of the generator. This circuitry greatly reduces the size and cost of a holding fixture and related components to make possible a low cost generator tester.

1 Claim, 3 Drawing Figures

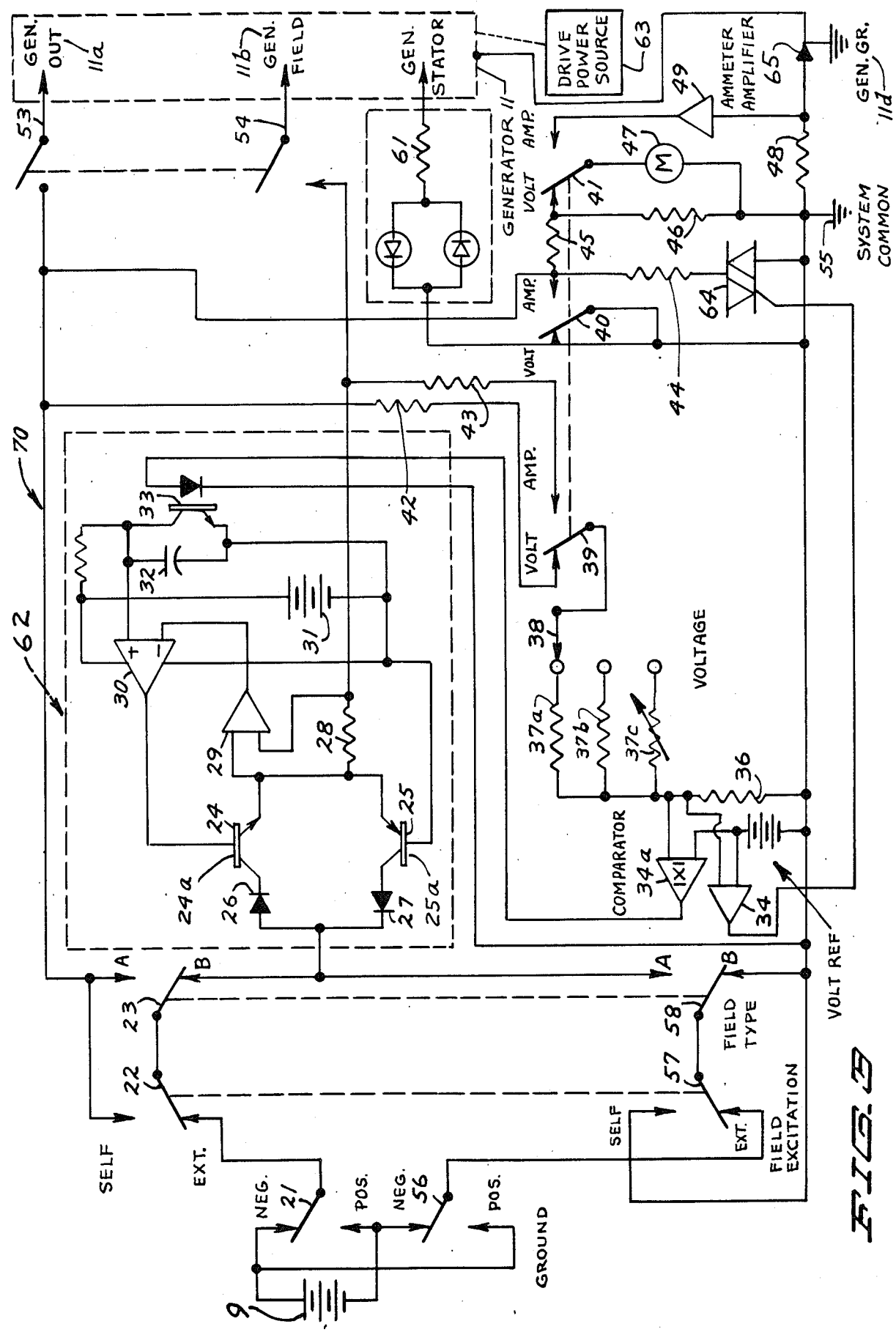

CIRCUITRY FOR TESTING GENERATOR OUTPUT

BACKGROUND OF THE INVENTION

1. Field of Invention

This invention relates to testing the current output capacity of a generator.

2. Description of the Prior Art

It is essential to know that a generator is operating at a rated output current capacity prior to being installed into operating position.

The usual procedure for testing the performance of a generator is to operate the generator by driving its rotor with a drive motor of adequate size, applying a variable field current to the generator, monitoring the output voltage and adjusting the output current with a variable load until the output voltage falls to the rated voltage at which point the output current is taken to be the full output current of the generator. It is noted that the drive motor must be of sufficient size to supply the energy to drive the rotor of the generator and apply the energy required to handle the load.

The usual method of testing a generator output requires the presence of considerable power to drive the generator and this procedure is costly.

Known in the prior art is the U.S. Pat. No. 2,578,694 to Goldman who claims a convenient device for rapid testing. The test of his patent does not give a clear understanding of what he is attempting but in final analysis it appears that Goldman turns off the generator while making his measurement of output, i.e., he provides a technique to magnetically saturate the field of the generator, remove the magnetizing drive force, and measure the resultant output current caused by the residual magnetism left in the field. This would not appear to provide an adequate reading of the operating conditions of a generator.

SUMMARY OF THE INVENTION

To overcome the objections present in the prior art testing procedures, it is the purpose of this invention, concisely stated, to measure the full output current capacity of a generator by measuring a proportional short circuited output current, while employing a fractional horsepower motor as the generator drive source, treating the generator as a controlled current source and not as a magnetic storage element or as a controlled voltage source.

It is an object herein to test the operation of a generator as closely as possible as if it were operated under a load to reflect a current output reading which would be present under actual operating conditions.

It is a further object herein to test a generator by providing a linear relationship between field voltage and output current, the output current becomes a function of the excitation of magnetic flux and said flux is exactly proportional to the field excitation current, which in turn is in exact proportion to the field excitation voltage. By dividing the field excitation voltage by a selected numerical factor and in increasing by said numerical factor, the reading of an ammeter, which is in circuit, to read the current output, will indicate full generator current output capacity but with the advantage of very much reduced horsepower requirements for the driving power to drive the rotor and provide the energy for the simulated load. This would result in greatly reduced supporting fixtures for the generator.

The invention herein may be applied to the testing of an alternator as well as to a generator.

These and other objects and advantages of the invention will be set forth in the following description made in connection with the accompanying drawings in which like reference characters refer to similar parts throughout the several views.

BRIEF DESCRIPTION OF THE DRAWINGS

FIG. 3 is a circuit diagram as a modification of FIG. 1.

DESCRIPTION OF A PREFERRED EMBODIMENT

Reference for purpose of illustration is had to current limiting generators. Nearly all generators presently being produced are of this type.

Figure 1:
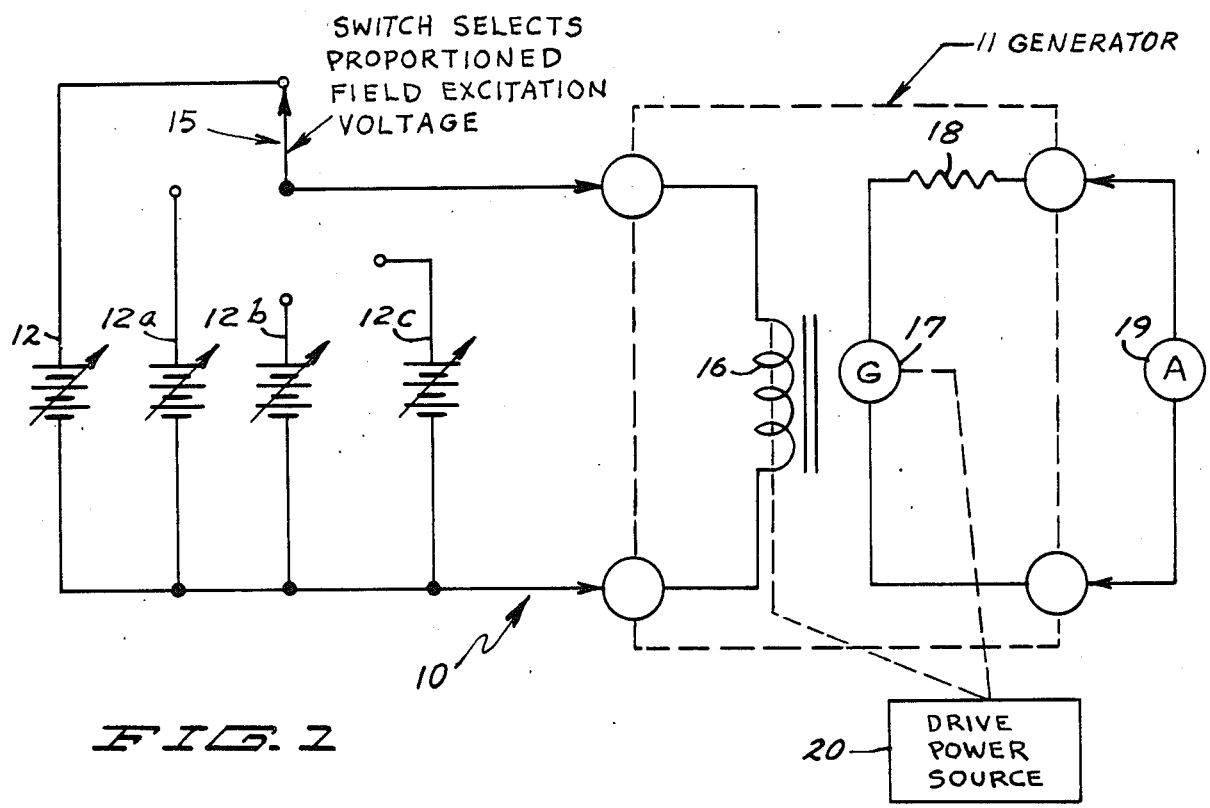
FIG. 1 is a schematic wiring diagram of the circuitry herein.

The wiring diagram of FIG. 1 is illustrative of the invention herein to achieve the objectives set forth in which a fraction of the rated voltage is applied to excite the field voltage of the generator and an ammeter is placed across the output terminals of the generator, treating the generator as a controlled current source and the ammeter being calibrated at the reciprocal of the reduced field voltage ratio to give a reading equal to the full output current capacity of the generator. The generator is short circuited to obtain a proportional output value which by means of calibration of the ammeter used gives an indicated full output current reading.

The circuitry of FIG. 1 is indicated by 10. The induced element 17 of the generator 11, which element may be the armature or stator of the generator, as the case may be, and indicated schematically, is in series with its internal lumped impedance 18 and is connected directly to a low impedance ammeter 19. Said ammeter will have a current range typical of the output current values of said generator. Thus said ammeter is in a short circuit arrangement with said generator.

The field current 16 is connected to a switch 15 for the selection of a desired adjustable voltage source as represented by the numerals 12, 12a, 12b and 12c, such as 6 volt, 12 volt, 36 volt, or other appropriate voltage. The purpose is to apply a proportional field excitation voltage to the field 16 which relates to the rated output voltage of the generator under test.

The generator as connected in FIG. 1 is now acting as a controlled current generator. The output current as measured by said ammeter 19 becomes a linear function proportional to the field excitation voltage at 16. When the field excitation voltage equals the rated output voltage, the measured output current of the generator at ammeter 19 will represent the full output current as if it were measured by a conventional prior art circuit.

A drive power source is indicated at 20 in FIG. 1 to drive the rotor and all that is required for operation here is sufficient power to supply the losses of the internal lumped impedance of the generator 11 and of the ammeter 19.

The procedure described has been sufficiently tested to assure the accuracy of the results indicated.

Figure 2:
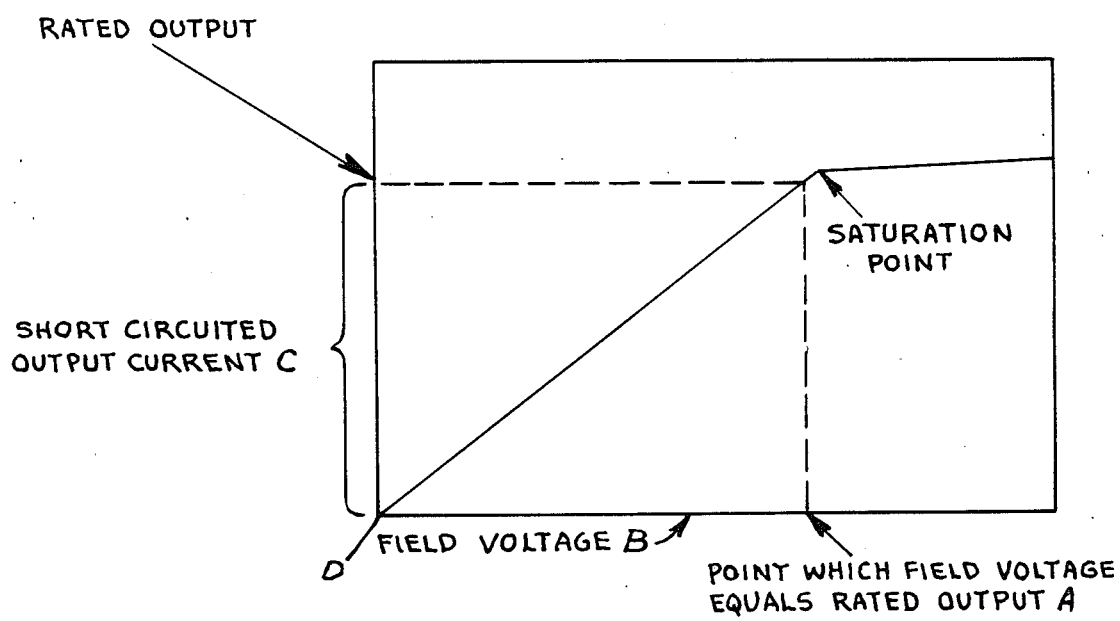
FIG. 2 is a graph showing short circuited output current compared to field voltage.

FIG. 2 is a graph of the short circuited output current C compared to field voltage D as above described. The field voltage B applied to the field 16 is the variable and is varied between zero volts and the rated full output voltage A of the generator, the full output voltage of the generator being the output voltage that is specified for the generator as that output voltage at which the full output current is measured. The short circuited output current becomes a linear function of field excitation voltage.

Significant benefit results from testing output voltage as described. The usual large load resistor used with prior art testing devices is replaced by a relatively inexpensive ammeter which provides an easily acquired reading which inherently automatically indicates full output current without user adjustments. The drive power source and related holding fixtures is greatly reduced and is such as to supply only the losses of the internal impedance of the generator 11 and the ammeter 19.

Referring again to FIGS. 1 and 2, by connecting the generator as indicated in FIG. 1, a linear relationship is established between the output current 19 and the field excitation voltage 16. By proportionately decreasing the field excitation voltage 16 and increasing the displayed current value of the ammeter 19, the ammeter can be calibrated to be made to show the full output current capacity of a generator with a relatively small drive motor for the drive power source 20.

By way of example a typical 130 ampere 12 volt generator with an internal lumped impedance of 0.040 ohms and a load impedance of 12 V/130 A or 0.0923 ohms consumes ($I^2 Z$), or 130 $A^2$ (0.040 Z+0.0923 Z), or 2236 watts, or 2236 W/746 W/H.P., or 3 horse power of drive power.

By measuring the short circuited current with ammeter 19 the load resistance reduces to practically zero ohms reducing the power drive requirements to 130 $A^2$ (0.040 Z)/746 or 0.91 horsepower.

Further, by reducing the field excitation to 6.0 volts, the actual output current would be 6/12 of 130 amperes or 65 amperes. Calibrating the ammeter 19 to read 12/6 of actual value would still indicate 130 amperes. Since the actual current is one half the input, $I^2 Z$ power requirements reduce to 65 $A^2$ (0.040)/746 or 0.226 horsepower. Therefore, the power drive requirements to indicate full output current can be decreased to 0.226/3 (100), or down to 7.55% of the prior art requirements for the indicated 12 volt generator while providing an accurate indication of the full output current.

Thus it is seen that by eliminating the need for a large load and a large power source as used in prior art practice and by using a fractional horsepower drive source coupled with an ammeter in place of a load, great simplification results. This simplification extends to the elimination of large mechanical drive components, large generator holding fixtures and the entire testing apparatus is proportionately reduced in size. The use of a relatively small drive motor increases the safety aspects of the testing and reduced electrical power requirements permit a standard 117 v A.C. outlet receptacle hook up.

FIG. 1 provides adequate detail for the testing circuitry described for one knowledgeable in the art involved.

The circuit of FIG. 1 can be used otherwise than as here described by simply supplying a voltage to the field, rotating the generator and measuring the resultant output current using conventional electronic power supplies and ammeters accomplishing the ratio conversions external to the measuring apparatus. Further, the circuit of FIG. 1 can be incorporated into a generator test unit in a variety of configurations without departing from the concept of the invention.

A modification of FIG. 1 is shown in FIG. 3. The circuitry of FIG. 3 permits the testing of a wide variety of generator configurations and readily accommodates, by way of example, the following generator variations: positive or negative polarity of ground; A,B, and isolated or internal regulator controlled type of field; self or external field excitation and will accommodate all rated output voltage capacities.

Referring now to FIG. 3, a circuit diagram 70 is shown embodying in principle the testing arrangement hereinabove described in FIG. 1 and showing in somewhat greater detail the circuitry components involved.

In this modification, the generator is first tested in a voltage mode to disclose whether the generator is fully functioning and second, the generator is tested in the current mode to measure and verify that its output current is in fact equal to its rated output current.

To accommodate said variations in generator configurations, FIG. 3 emphasizes the use of a single regulator or electronic switch 62 (to be described). The sensing circuit of switch 62 can be caused to sense field voltage to apply the proportioned field voltage to the field as in FIG. 1 for current capacity measurements or can sense the generators output terminal to test the generator in the voltage mode. The obvious advantage of FIG. 3 is to maximize the economy of the generator testing. The circuit of FIG. 3 also embodies a meter adapted to display output voltage in the voltage mode and output current in the current mode.

The circuitry of FIG. 3 is indicated generally by the reference numeral 70 and as indicated, it is to be connected to generator 11 in the manner of the circuitry of FIG. 1 in having the switch contact 53 connected to the output terminal 11a of a said generator and the switch contact 54 connected to the field 11b of said generator. The contact 65 connects to the generator ground terminal 11d. The operation of the switch 53-54 will provide a connection for a calibrated current output reading to be read on the meter 47 (serving here as an ammeter) as representing the full generator current output, as will be further described.

Referring to the circuitry of FIG. 3, the reference numeral 9 indicates a floating power supply and all voltages with regard to the circuitry are referenced to the circuitry common 55.

The ground type select switches 21-56 respectively determine the polarity of the floating power supply for either a positive or a negative ground generator.

The input to the electronic switch 62 to be described, is from the field selector coupled A-B switches 23-58 are manually controlled and are set to match the field circuit of the generator to be tested. The field excitation coupled switches 22-57 for self excitation or an external power supply for excitation are manually controlled and return the electronic switch 62 back to said floating power supply 9 for external type of excitation or to the generator output terminal 11a for self excitation.

The switch 62 is described as a bilateral current and voltage limited optical coupled isolated controlled switch.

Said switch 62 consists, as shown, of two side by side connected NPN 24 and PNP 25 power transistors with base emitter circuits 24a and 25a connected in such a way that a common bias current supplied by the amplifier 30 switches both transistors on or off simultaneously. The diodes 26 and 27 direct the polarity field current to the appropriate power transistor.

The current sense resistor 28 and amplifier 29 control the amplifier 30 in conventional manner such that power transistors 24 and 25 are operated within their safe operating range.

The floating power supply 31 as a component of said switch 62 provides for power to said switch while permitting said switch to float above or below said ground reference point 55.

The optically coupled isolator 33 acts as an electronic relay to turn said switch 62 on or off.

The capacitor 32 determines the transition rate at which said switch 62 will switch as to eliminate the need for flyback diodes in the generator field circuit.

In circuit with said switch 62 is an absolute voltage comparator 34 which in the voltage mode obtains its reference from voltage source 35 and obtains its sample voltage by way of the attenuation network 36-37, the generator volt selector switch 38, the volt-amp selector switch 39, the dropping resistor 42, test switch 53 and out to the generator output terminal 11a.

The volt selector switch 38 which is like the switch 15 of FIG. 1 will be set to be in contact with the appropriate voltage source for the generator being tested with 37a having reference to a six volt, 37b to a twelve volt and 37c to a variable adjustable voltage source, by way of example.

A load resistor 44 provides a light load on the generator sized by the drive power source 63 and is adapted to place the correct load on the generator for making accurate voltage regulator adjustments.

Said meter 47 is a bi-polar type preferably digital with a polarity indication and in the voltage mode is connected to a voltage divider 45-46 through the volts-amp switch 41 to read the output voltage of the generator.

A triac 64 in circuit between the load resistor 44 and the common 55 receives a command from the comparator 34 to switch in the load resistor 44 after the generator reaches approximately 90% of its rated voltage to permit the use of a drive power source 63 with low starting torque characteristics to further reduce the cost of the generator testing as described herein.

L.E.D. indicators 61 are provided as indicated to become illuminated with the presence of a stator 11c output voltage.

In the voltage testing mode, the volt-amp switches 39, 40 and 41 are moved to the left, as viewed in FIG. 3, which are the volt testing positions for verification of the voltage operation, the output being read on the meter 47, which with the switching as indicated, functions as a volt meter.

In the current mode, the volt-amp switches 39, 40 and 41 are switched to the right as viewed in the drawing to accomplish the following. Switch 39 connects the comparator 34a to the field circuit of the generator. The action of the electronic switch 62 and comparator 34 is to regulate the field voltage of the generator to be at a test voltage value which is proportional to the rated output voltage of said generator.

The switch 40 is placed in the circuitry to short out the load resistor 44 and the triac 64 to effectively place the ammeter shunt 48 across the output terminals of the generator, as previously shown as ammeter 19 in FIG. 1.

The switch 41 switches the meter 47 to the amplifier 49 which amplifies the shunt voltage 48 according to the ratio of the rated output voltage to the reduced field voltage to get a calibrated full output reading on the meter 47. Attenuator 43 sets the reduced field voltage to a rated voltage ratio which is the proportional excitation voltage. Thus the circuitry of FIG. 3 as described relates to the circuit of FIG. 1.

By operating the coupled test switches 53-54, the circuit is completed to the generator and full output current is displayed on said meter 47 which is now acting as an ammeter. Said switches preferably are spring loaded momentary switches.

The operation of the circuitry is believed to be understood from the description given. The hardware used to conveniently hold a generator for testing is not shown and is not a part of the invention herein. The ease and simplicity of the testing derives from the use of a power input to operate a generator which represents but a proportion of the output power of the generator and is accomplished by applying to the field of the generator a proportion of the rated output voltage of the generator and placing an ammeter directly across the output terminals, treating the generator as a controlled current source, the ammeter reading being calibrated at a reciprocal of the reduced field voltage ratio to display a reading which represents the full output current capacity of the generator.

It will of course be understood that various changes may be made in the form, details, arrangement and proportions of the product without departing from the scope of applicant's invention which, generally stated, consists in a product capable of carrying out the objects above set forth, such as disclosed and defined in the appended claims.

What is claimed is:

1. Means measuring the short circuit output current of a generator with an excitation voltage proportional to the rated output voltage of the generator, comprising a circuitry including an ammeter in circuit with a generator, an induced element of said generator being in series with the internal impedance of said generator and with said ammeter, short circuiting said generator, said circuitry including an appropriate voltage source, said voltage source providing an excitation voltage applied to the field of said generator, means causing said excitation voltage to be a predetermined proportion of the rated voltage of said generator, whereby the output current of said generator passes over said ammeter as a linear function proportional to said field excitation voltage, said ammeter being calibrated to convert the reading of said current passing thereover into a direct reading of the full output current of said generator under load, said circuitry including an absolute value comparator referenced to a common voltage source, and a switch selectable attenuator in connection with said comparator monitoring the output voltage of said generator.

* * * * *